United States Patent
Bolton et al.

(10) Patent No.: US 9,941,840 B2
(45) Date of Patent: *Apr. 10, 2018

(54) FAST PULSE GENERATOR

(71) Applicant: THE UNIVERSITY COURT OF THE UNIVERSITY OF ST. ANDREWS, St. Andrews (GB)

(72) Inventors: David Robert Bolton, Fife (GB); Graham Smith, Fife (GB)

(73) Assignee: The University Court of The University of St. Andrews (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/610,477

(22) Filed: Jan. 30, 2015

(65) Prior Publication Data

US 2015/0288332 A1 Oct. 8, 2015

Related U.S. Application Data

(62) Division of application No. 11/575,969, filed on May 16, 2008, now Pat. No. 8,963,602.

(51) Int. Cl.
*H03K 3/00* (2006.01)
*H03B 19/00* (2006.01)
*H03B 19/16* (2006.01)

(52) U.S. Cl.
CPC .................. *H03B 19/16* (2013.01)

(58) Field of Classification Search
USPC ......... 327/113, 116, 119, 172, 291, 292, 299
See application file for complete search history.

(56) References Cited

U.S. PATENT DOCUMENTS

| | | |
|---|---|---|
| 3,711,784 A | 1/1973 | Heise |
| 3,925,648 A | 12/1975 | Speiser et al. |
| 4,516,085 A | 5/1985 | Effinger et al. |
| 5,337,014 A | 8/1994 | Najle et al. |
| 5,530,928 A | 6/1996 | Wheatley, III et al. |
| 6,026,307 A | 2/2000 | Blom et al. |
| 7,022,074 B2 | 4/2006 | Kristoffersen et al. |

OTHER PUBLICATIONS

Bambha, et al.: "*A Compact Millimeter Wave Radar for Airborne Studies of Clouds and Precipitation*"; Geoscience and Remote Sensing Symposium Proceedings, 1998, IGARSS '98. 1998 IEEE International Seattle, WA, USA Jul. 6-10, 1998, New York, NY, USA, IEEE, US, vol. 1, Jul. 6, 1998, pp. 443-445, XP010293319, ISBN: 0-7803-4403-0 p. 443, right-hand column—p. 444, right-hand column; figure 2.

Blok, et al.: "*A Continuous-Wave and Pulsed Electron Spin Resonance Spectrometer Operating at 275 GHz*"; Journal of Magnetic Resonance 166 (2004) 92-99; received Jul. 7, 2003, revised Sep. 25, 2003.

(Continued)

*Primary Examiner* — An Luu
(74) *Attorney, Agent, or Firm* — Tarolli, Sundheim, Covell & Tummino LLP

(57) ABSTRACT

A pulse generator is disclosed. The pulse generator can include a pulsed switch, such as a diode. The pulsed switched can be connected between an input source, such as an oscillator and a frequency multiplier.

8 Claims, 3 Drawing Sheets

(56) References Cited

OTHER PUBLICATIONS

Chaohua, et al.: "*A 3mm-Wave Battle Field Surveillance Radar for the Mini-UAV*"; 2001 CIE International Conference on, Proceedings Oct. 15-18, 2001; Piscataway, NJ USA, IEEE, Oct. 15, 2001, pp. 154-157, XP010577792, ISBN: 0-7803-7000-7, p. 155, left-hand column, line 1—p. 156, right-hand column, line 4; figure 1.
International Search Report for corresponding PCT/GB2005/003620 completed Feb. 10, 2006 by B. Meulemans of the EPO.
Klymyshyn: "*Active Frequency-Multiplier Design Using CAD*"; IEEE 2003, The British Library, Downloaded Dec. 21, 2009 from IEEE Xplore; pp. 1377-1385.
O'Ciardha: "*Generic-Device Frequency-Multiplier Analysis—A Unified Approach*"; IEEE 2000; The British Library; Downloaded on Dec. 21, 2009; IEEE Xplore; pp. 1134-1141.
Ohba, et al.: "*A New Pulse Width Reduction Technique for Pulsed Electron Paramagnetic Resonance Spectroscopy*"; Journal of Magnetic Resonance 191 (2008) 1-6; received Aug. 7, 2007, revised Oct. 14, 2007.

FAST PULSE GENERATOR

RELATED APPLICATIONS

This application is a divisional of U.S. patent application Ser. No. 11/575696, filed 21 Mar.2007; which claims priority from GB 0421178.5, filed 23 Sep. 2004, both of which are incorporated herein in their entirety.

TECHNICAL FIELD

The present invention relates to a fast pulse generator, and in particular a fast radio frequency pulse generator having an output in the frequency range of tens of kilohertz to 100s of gigahertz.

BRIEF SUMMARY OF THE INVENTION

FIG. 1 shows a conventional radio frequency switch pulse generator. This has an oscillator that is connected to a pulsed switch, thereby to provide a fast, pulsed output. In practice, the switch is typically a diode. A disadvantage of this arrangement is that the switch parameters determine the output pulse width. A further limitation is that when a diode is used, pulse rise times are limited by the intrinsic bandwidth of the switch pulse input, which in turn limits the output pulse rise time. In addition, the switch has an insertion loss, which reduces the output power. Also, the output power is restricted by the power handling capability of the switch. Any attempt to overcome the losses using an amplifier, places restrictions on the amplifier bandwidth, and as frequency increases these restrictions become more difficult to satisfy.

An object of the present invention is to provide an improved fast pulse generator.

According to one aspect of the present invention, there is provided a pulse generator including a pulsed switch connected between an ac source, such as an oscillator, and a non-linear frequency multiplier.

Because the frequency multiplier is a non-linear device that only conducts above a threshold and saturates very quickly, an effective sharpening of the pulse edges is provided, which allows for the generation of shorter, and so faster, output pulses.

The pulsed switch may be a semiconductor diode. The pulsed switch may be a mixer means. The switch may be operable to produce bi-phase pulses. The switch may be operable to produce multi-phasic pulses.

A plurality of frequency multipliers may be provided. In this case, the pulsed switch may be provided between adjacent multipliers.

The generator may include at least one amplifier. The amplifier may be connected between the pulsed switch and the frequency multiplier. Where a plurality of frequency multipliers is provided, the amplifier may be connected between two of these multipliers. The amplifier may be connected to an output of the frequency multiplier.

The pulse generator may be configured to provide a pulsed output having a frequency in the range of tens of kilohertz to 100s of gigahertz.

The pulse generator may be fabricated on a single chip, making it ideal for inclusion in integrated circuits. Alternatively, the generator could be constructed from separate components.

BRIEF DESCRIPTION OF THE DRAWINGS

Various aspects of the invention will now be described by way of example only and with reference to the accompanying drawings, of which.

DETAILED DESCRIPTION

Figure 1:
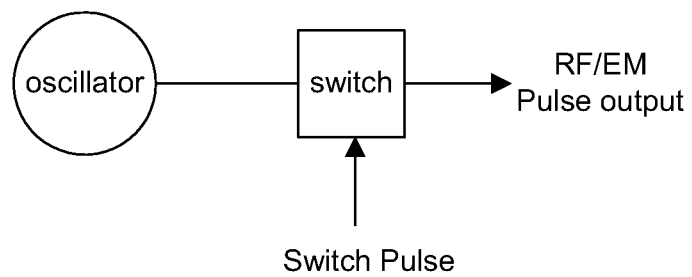
FIG. 1 shows a conventional radio frequency switch pulse generator.
Figure 2:
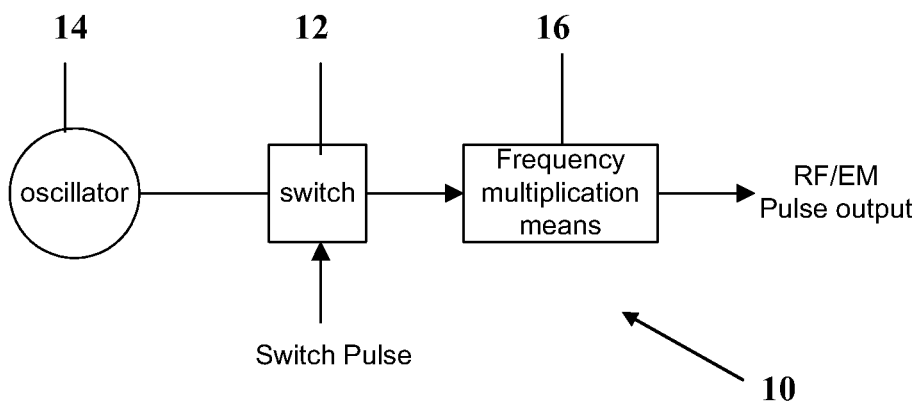
FIG. 2 is block diagram of a pulse generator.
Figure 3:
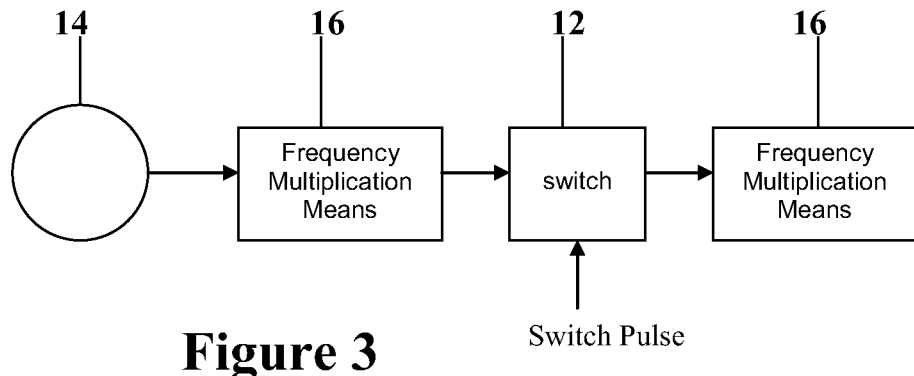
FIG. 3 is modified version of the pulse generator of FIG. 2.

FIG. 2 shows a pulse generator 10 including a pulsed switch 12 connected between an oscillator 14 and a frequency multiplier 16. Any suitable oscillator 14 could be used, provided it is able to drive the frequency multiplier non-linearly 16. The multiplier 16 may include one or more non-linear devices, for example one or more varactor diodes, FETs, bipolar or other types of diode. Although FIG. 2 shows only a single frequency multiplier 16, there may be a plurality of these, with the pulsed switch 12 connected between adjacent multipliers, as shown in FIG. 3. The pulsed switch 12 may be a semiconductor device or a mixer means, for example, a diode or a four-quadrant multiplier or double balanced mixer or any other relatively fast switch. In any case, the switch 12 may be operable to produce bi-phase pulses. Alternatively, the switch 12 may be operable to produce multi-phasic pulses.

Because the multiplier 16 of FIGS. 2 and 3 is a nonlinear device that only conducts above a threshold and saturates very quickly, an effective sharpening of the pulse edges is observed. In practice, this means that the pulses are shorter and so faster.

Various device configurations have been tested. In one example, the oscillator 14 was a YIG (Yttrium Iron Garnet) oscillator tunable from 6.8 to 8.8 GHz with a power output of +15 dBm, followed by a varactor diode multiplier chain. The gating switch pulse width was 600 ps at about 100 MHz. This provided output pulses having a width of 260 ps at 94 GHz. In another example, the oscillator used was a dielectric resonator oscillator, which provided a fixed frequency of 7.833 GHz, followed by a varactor diode multiplier chain. In this case, the gating switch pulse width was 1 ns at about 100 MHz and the output pulses had a width of 650 ps at 94 GHz. These examples are by no means exclusive, but instead are provided for the purposes of illustrating the benefits of the invention. The type of oscillator and required output power are dependant only upon system requirements.

The pulse generator in which the invention is embodied can be used for many applications, particularly radar applications. For example, the invention could be of particular use in radar based collision avoidance systems. Because of the very high speeds achievable using the generator, the accuracy and resolution of such systems would be greatly improved.

Figure 4:
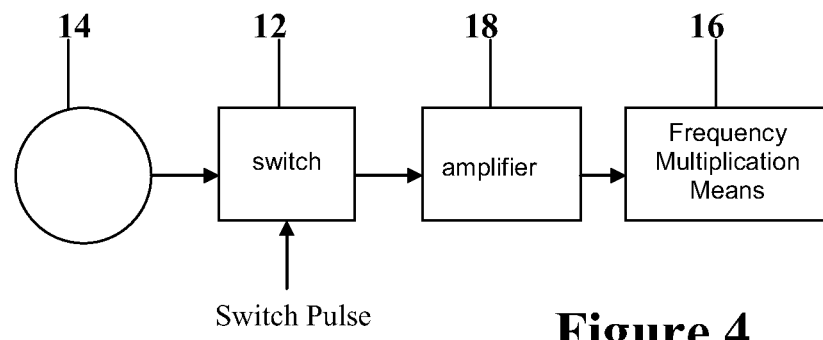
FIG. 4 is another modified version of the generator of FIG. 2.
Figure 5:
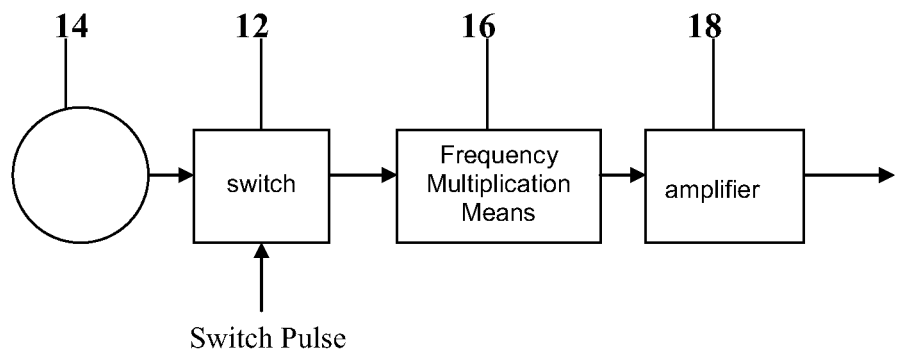
FIG. 5 is yet another modified version of the generator of FIG. 2.
Figure 6:
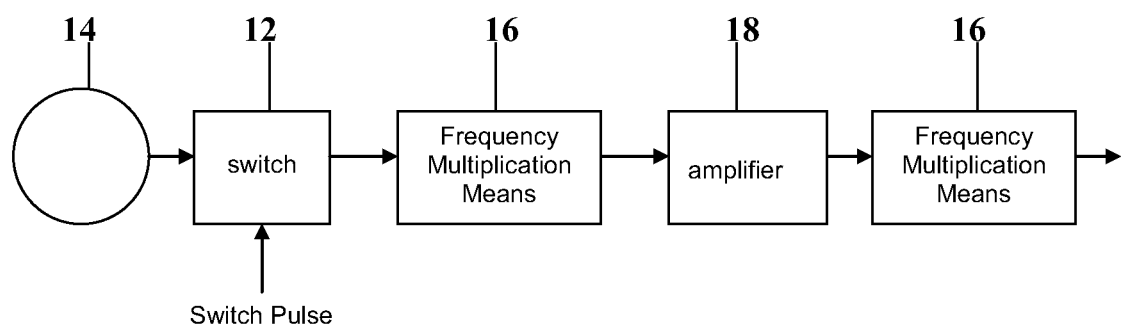
FIG. 6 is still another modified version of the generator of FIG. 2.

A skilled person will appreciate that variations of the disclosed arrangements are possible without departing from the invention. For example, because processing by the frequency multiplier will reduced the pulse signal amplitude, at least one amplifier 18 may be provided for recovering that pulse amplitude. This may be provided between the pulsed switch 12 and the frequency multiplier 16, as shown in FIG. 4. Where a plurality of frequency multipliers 16 is provided, the amplifier 18 may provided between two of these multipliers 16, as shown in FIG. 5. Alternatively or additionally, the amplifier 18 may be connected to an output of the frequency multiplier 16, as shown in FIG. 6. Accordingly the above description of the specific embodiment is made by way of example only and not for the purposes of limitation. It will be clear to the skilled person that minor modifications may be made without significant changes to the operation described.

What we claims is:

1. A pulse generator including:
   an ac source for providing an ac signal;
   a switch connected to an output of the ac source;
   a non-linear frequency multiplier connected to the output of the switch;
   means for causing the switch to be pulsed to generate a pulsed ac signal at the output of the switch that is connected to the non-linear frequency multiplier, whilst the output is connected to the non-linear frequency multiplier, so that pulses are applied to the non-linear frequency multiplier,
   wherein the non-linear frequency multiplier shortens the pulses of the pulsed output, and the switch comprises a mixer.

2. A pulse generator as claimed in claim 1 wherein the pulsed switch is a semiconductor diode.

3. A pulse generator as claimed in claim 1 wherein a plurality of frequency multipliers is provided and the pulsed switch is provide between adjacent such multipliers.

4. A pulse generator as claimed in claim 1 including at least one amplifier.

5. A pulse generator as claimed in claim 1 comprising at least one amplifier, the at least one amplifier being provided between the pulsed switch and the frequency multiplier.

6. A pulse generator as claimed in claim 1 comprising at least one amplifier and a plurality of frequency multipliers, wherein at least one amplifier is provided between two of the multipliers.

7. A pulse generator as claimed in claim 1 comprising at least one amplifier, wherein at least one amplifier is connected to an output of the frequency multiplier.

8. A radar system that includes the pulse generator as claimed in claim 1.

* * * * *